(12) United States Patent
Seo

(10) Patent No.: US 7,202,561 B2
(45) Date of Patent: Apr. 10, 2007

(54) SEMICONDUCTOR PACKAGE WITH HEAT DISSIPATING STRUCTURE AND METHOD OF MANUFACTURING THE SAME

(75) Inventor: Jeong-Woo Seo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/046,514

(22) Filed: Jan. 28, 2005

(65) Prior Publication Data

US 2005/0224957 A1    Oct. 13, 2005

(30) Foreign Application Priority Data

Jan. 28, 2004    (KR)    ............. 10-2004-0005464

(51) Int. Cl.
*H01L 23/34*    (2006.01)

(52) U.S. Cl. .............. 257/720; 257/706; 257/707; 257/712; 257/713; 257/E23.08; 257/669; 257/675; 257/E23.104; 257/E23.101; 257/E23.102

(58) Field of Classification Search .............. 257/706, 257/720
See application file for complete search history.

(56) References Cited

U.S. PATENT DOCUMENTS

| | | | | |
|---|---|---|---|---|
| 5,610,442 | A * | 3/1997 | Schneider et al. | 257/787 |
| 6,236,568 | B1 * | 5/2001 | Lai et al. | 361/704 |
| 6,400,014 | B1 * | 6/2002 | Huang et al. | 257/712 |
| 6,462,405 | B1 * | 10/2002 | Lai et al. | 257/675 |
| 6,559,525 | B2 * | 5/2003 | Huang | 257/675 |
| 6,593,652 | B2 * | 7/2003 | Shibata | 257/710 |
| 6,734,522 | B2 * | 5/2004 | Maruyama | 257/503 |
| 6,734,552 | B2 * | 5/2004 | Combs et al. | 257/707 |
| 6,946,729 | B2 * | 9/2005 | Lee et al. | 257/707 |
| 2004/0046241 | A1 * | 3/2004 | Combs et al. | 257/678 |

FOREIGN PATENT DOCUMENTS

| | | |
|---|---|---|
| JP | 04155853 | 5/1992 |
| JP | 07142647 | 6/1995 |
| JP | 2000-77575 | 3/2000 |
| KR | 1995-24313 | 8/1995 |

OTHER PUBLICATIONS

Richard C. Jaeger, Gerold W. Neudeck, & Robert F. Pierret, Introduction to Microelectronic Fabrication, 2002, Prentice Hall, Second Edition / vol. V, p. 178.*
Charles A. Harper, Electronic Packaging and Interconnection Handbook, 1991, McGraw-Hill, p. 1.35.*
English language abstract of the Korean Publication No. 1995-24313.
English language abstract of the Japanese Publication No. 2000-77575.

* cited by examiner

*Primary Examiner*—Minhloan Tran
*Assistant Examiner*—Eduardo A. Rodela
(74) *Attorney, Agent, or Firm*—Marger Johnson & McCollom, P.C.

(57) ABSTRACT

A semiconductor package in which heat is easily dissipated and a semiconductor chip is not damaged during a molding process, and a method of manufacturing the same. The semiconductor package with a heat dissipating structure includes a substrate, a semiconductor chip, which is mounted on the substrate and electrically connected with the substrate by bonding means, a heat slug which is adhered to the semiconductor chip and formed of a thermally conductive material, and a heat spreader partially exposed to the outside of the semiconductor package, and which is formed on the heat slug to be spaced a buffer gap apart from the heat slug.

18 Claims, 4 Drawing Sheets

SEMICONDUCTOR PACKAGE WITH HEAT DISSIPATING STRUCTURE AND METHOD OF MANUFACTURING THE SAME

This application claims priority of Korean Patent Application No. 10-2004-0005464 filed on Jan. 28, 2004 in the Korean Intellectual Property Office, the disclosure of which is incorporated herein in its entirety by reference.

BACKGROUND OF THE INVENTION

1. Field of the Invention

The present invention relates to a semiconductor package with a heat dissipating structure and a method of manufacturing the same, and more particularly, to a semiconductor package with a heat dissipating structure and a method of manufacturing the same for preventing malfunction of a semiconductor chip due to a hindrance in thermal dissipation when needing to rapidly dissipate heat that is generated during a high-speed operation of the semiconductor chip to the outside of the package using a heat spreader and a heat slug.

2. Description of the Related Art

Generally, thermal dissipation is an important characteristic of semiconductor packages used by high-speed, high-frequency application specific integrated circuit (ASIC) products or high-speed semiconductor memory devices such as dynamic random access memories (DRAMs) and static random access memories (SRAMs).

There has recently been a growing demand for high-speed and high-output semiconductor devices, and semiconductor packages accommodate such demand. Semiconductor packages now being developed or having been developed are roughly classified into two types in terms of a power end demanding high-output: a plastic package type in which a heat sink is usually adhered to a power transistor or a module device, and a heat dissipating type in which heat generated during the operation of electronic components is easily dissipated by using a metal housing for a ceramic substrate.

FIG. 1 is a cross-sectional view of a conventional ball grid array (BGA) package 100.

As shown in FIG. 1, the BGA package 100 includes a substrate 110, a semiconductor chip 130 and a heat sink 170.

The semiconductor chip 130 is adhered to an upper surface of the substrate 110 and electrically connected with the substrate 110 by bonding wires 140. The BGA package 100 having the above-described construction has the heat sink 170 for effectively dissipating heat generated to the outside the BGA package 100, when operating electronic components formed within the semiconductor chip 130. As shown in FIG. 1, the heat sink 170 is located at an upper part of the semiconductor chip 130 and one surface of the heat sink 170 is exposed to the outside of the BGA package 100. Thus, the heat generated from the semiconductor chip 130 can be easily dissipated to the outside of the BGA package 100.

After the heat sink 170 is formed on the semiconductor chip 130, the bonding wires 140 and the heat sink 170 on the substrate 110 are encapsulated by insulating encapsulant resin 180. As described above, the heat sink 170 is encapsulated to expose one surface thereof to the outside of the BGA package 100.

Solder balls 190 are formed on a lower surface of the substrate 110 on which the semiconductor chip 130 is mounted.

The BGA package 100 is provided with the conventional heat sink 170 to ensure improved thermal properties compared to another conventional BGA package without a heat sink. The heat sink 170 is exposed to a surface of the BGA package 100 so that the heat generated when operating the electric components formed in the semiconductor chip 130 is easily dissipated to the outside of the BGA package 100.

In the BGA package 100 including the conventional heat sink 170, some of the heat generated from the semiconductor chip 130 is dissipated to the outside of the BGA package 100 through the substrate 110 located at a lower part of the semiconductor chip 130, and the rest is dissipated to the outside of the BGA package 100 through the heat sink 170 located at the upper part of the semiconductor chip 130.

The heat sink 170 is formed on the semiconductor chip 130 to be spaced a distance (L1 in FIG. 1) of about 300–400 μm apart from the semiconductor chip 130 so as not to damage the bonding wires 140. The gap L1 is filled with the insulating encapsulant resin 180. Generally, a highly thermally conductive material, for example a metal material, is used as the heat sink 170. Disadvantageously, the insulating encapsulant resin 180 is known to have a low thermal conductivity, however.

Accordingly, in the conventional BGA package 100 the semiconductor chip 130 is not directly in contact with the heat sink 170, so most of the heat generated from the semiconductor chip 130 is transferred to the heat sink 170 in the form of radiant heat. Accordingly, thermal dissipation is not efficient with the conventional BGA package structure.

SUMMARY OF THE INVENTION

The invention provides a semiconductor package with a heat dissipating structure in which heat generated by the operation of electronic components formed in a semiconductor chip is efficiently dissipated by providing various heat dissipating means; the reliability of the operation of the electronic components can be improved; and the semiconductor chip can be prevented from being pressed by a mold when the semiconductor package is encapsulated by encapsulant resin after arranging the heat dissipating means. The invention also provides a method of manufacturing the semiconductor package.

In accordance with an aspect of the invention, there is provided a semiconductor package with a heat dissipating structure comprising a substrate; a semiconductor chip mounted on the substrate and electrically connected thereto; a heat slug coupled to the semiconductor chip and formed of a thermally conductive material; and a heat spreader partially exposed to the outside of the semiconductor package and formed on the heat slug to be spaced apart from the heat slug.

In accordance with another aspect of the invention, there is provided a method of manufacturing the semiconductor package with a heat dissipating structure comprising electrically coupling a semiconductor chip to the substrate; coupling a heat slug made of a thermally conductive material to an upper surface of the semiconductor chip; and forming a heat spreader over an upper part of the heat slug to be spaced apart from the heat slug.

Other objectives, advantages, and features of the invention will become more apparent from the following detailed description when taken in conjunction with the accompanying drawings.

BRIEF DESCRIPTION OF THE DRAWINGS

The above features and advantages of the present invention will become more apparent by describing in detail exemplary embodiments thereof with reference to the attached drawings.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Semiconductor packages according to embodiments of the present invention constitute high-frequency microprocessors or ASIC products, or high-speed semiconductor memory devices such as DRAMs or SRAMs. Such devices mostly have input/output terminals with multiple pins. Semiconductor packages constituting such devices can be classified according to the multiple pin configurations, for example, a plastic or ceramic pin grid array (PGA) package, a land grid array (LGA) package, a ball grid array (BGA) package, a quad flat package, a lead frame package, and the like.

Further, substrates that can be applied to the semiconductor package according to the present invention include a printed circuit board, a ceramic substrate, a metal substrate, a silicon substrate, and the like, which can be applied to semiconductor packages such as a PGA package, a LGA package, a BGA package, a quad flat package and a lead frame package.

Hereinafter, a BGA package is used as the semiconductor package and a printed circuit board is used as the substrate in the embodiment of the present invention for convenience of explanation.

The embodiment of the present invention is explained with reference to FIGS. 2A to 2E.

FIGS. 2A to 2E are cross-sectional views showing a method of manufacturing a semiconductor package according to a preferred embodiment of the present invention. This method and the figures will be explained later.

Figure 1:
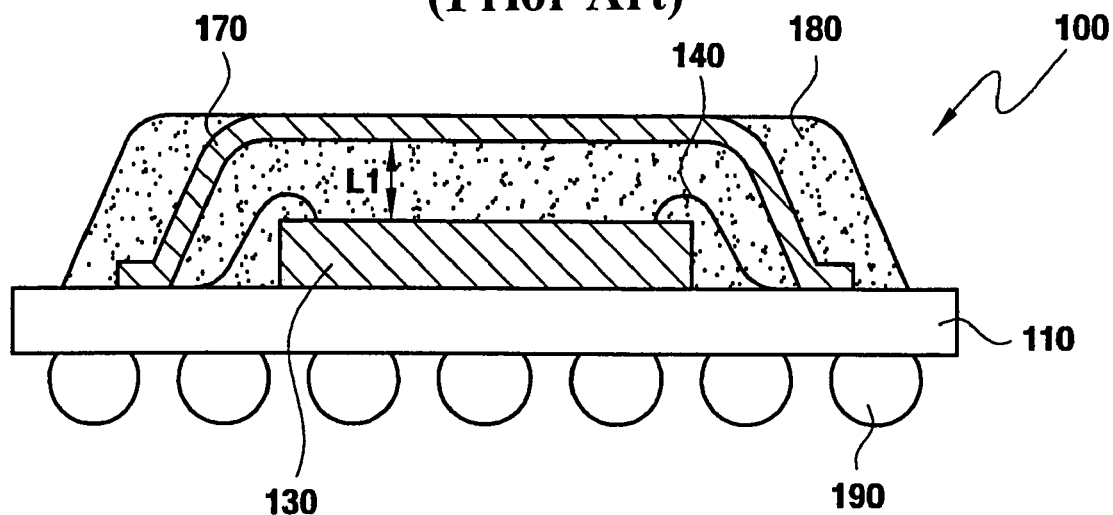
FIG. 1 is a cross-sectional view of a conventional ball grid array package (BGA).
Figure 2A:
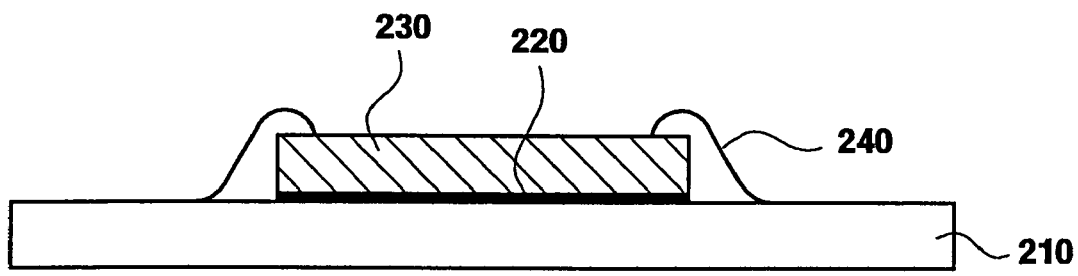
FIGS. 2A through 2E are cross-sectional views showing a method of manufacturing a semiconductor package according to the present invention.
Figure 2B:
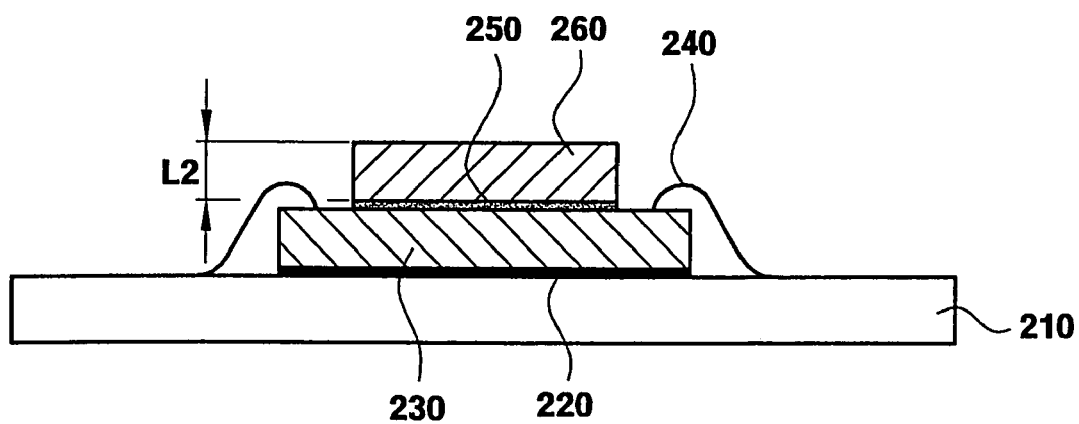
Figure 2C:
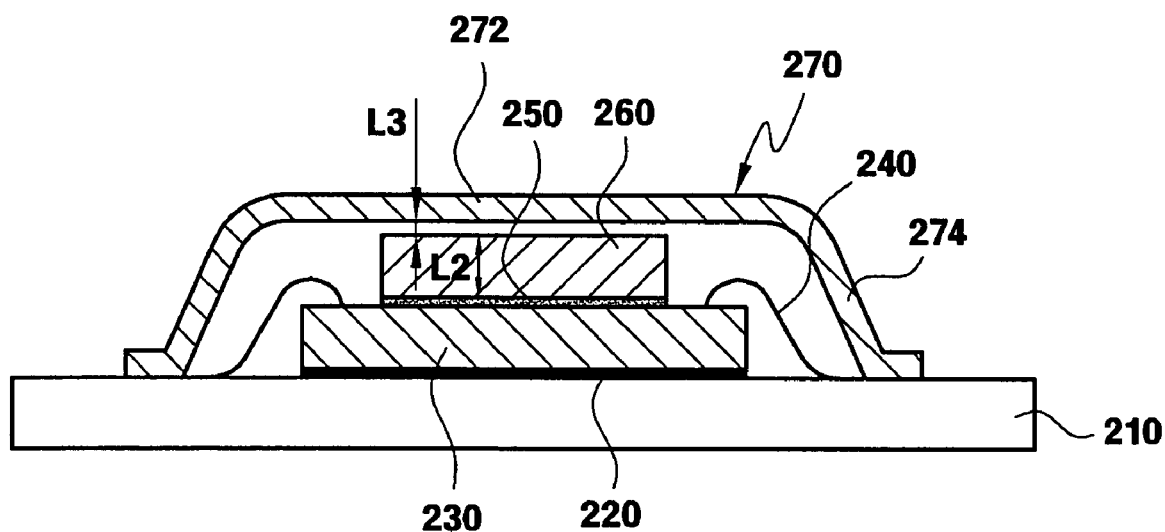
Figure 2D:
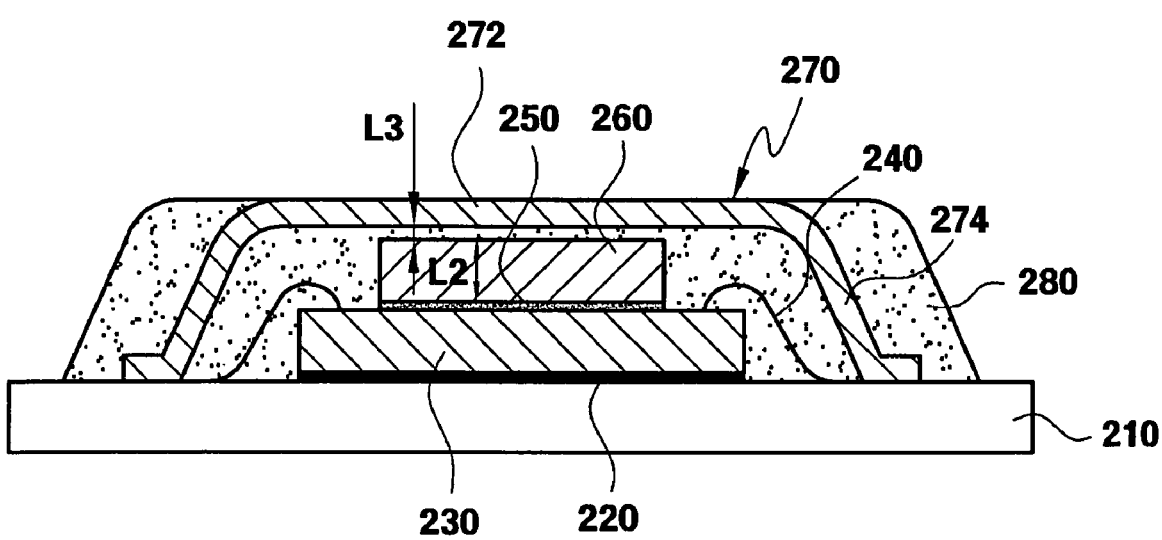
Figure 2E:
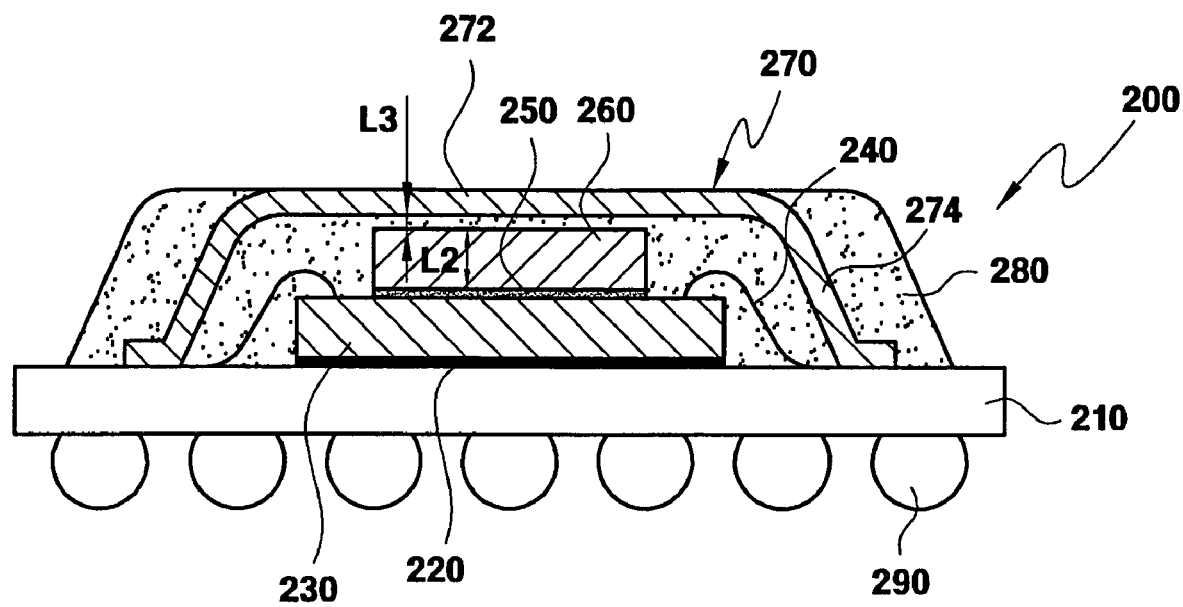

As shown in FIG. 2E, a semiconductor package 200 according to the illustrative embodiment of the present invention includes a substrate 210, a semiconductor chip 230, a heat slug 260, and a heat spreader 270.

Here, the substrate 210 has a plurality of solder balls 290 formed on a lower part of the substrate 210. Coupling the solder balls 290 to the substrate 210 can be performed at any stage, regardless of the order of formation of the semiconductor package 200.

The semiconductor chip 230 is mounted on an upper surface of the substrate 210 and adhered to the substrate 210 by an adhesive 220. Here, a silver paste is typically used as the adhesive 220. The semiconductor chip 230 is a chip having a high-frequency microprocessor or ASIC product or a high-speed memory device, e.g., a DRAM or SRAM, embodied therein.

Bonding pads (not shown) of the semiconductor chip 230 and electrode pads (not shown) of the substrate 210 are electrically connected to each other by bonding means 240. Although the bonding wires are used as the bonding means 240 in the illustrative embodiment of the present invention, the present invention is not limited thereto. That is, the semiconductor chip 230 and the substrate 210 can be electrically connected to each other by flip chip bonding, for example. The bonding wires may be formed of gold, copper, aluminum or a combination thereof.

The heat slug 260 is made of a thermally conductive material and adhered to an upper part of the semiconductor chip 230. Here, the heat slug 260 is preferably made of a highly thermally conductive material selected from the group consisting of copper, a copper alloy, aluminum, an aluminum alloy, steel, stainless steel, and a combination thereof. Further, the heat slug 260 may be made of one selected from the group consisting of ceramic, an insulator or a semiconductor material. The heat slug 260 may be formed by casting, forging or press-molding.

The heat slug 260 can be adhered to the semiconductor chip 230 using an adhesive 250. Here, the adhesive 250 must meet several requirements, including not affecting the surface of the semiconductor chip 230 and properly supporting the heat slug 260. The adhesive 250 is an electric insulator, preferably a heat conductor. Thermally conductive resin is also preferably used as the adhesive 250. More preferably, silicon rubber or a buffer binder consisting of an elastomer material is used as the adhesive 250. The adhesive 250 mitigates the transfer of external impact to the semiconductor chip 230 so that damage of the semiconductor chip 230 due to external impacts is suppressed. Further, the heat slug 260 can be prevented from being peeled off due to a difference in coefficients of thermal expansion between the heat slug 260 and the semiconductor chip 230.

Thermo-plastic adhesive epoxy, thermo-setting adhesive epoxy, thermally conductive epoxy, an adhesive tape, or a combination thereof can also be used as the adhesive 250.

In the illustrative embodiment of the present invention, the heat slug 260 disposed between the semiconductor chip 230 and the heat spreader 270, which will be described below, preferably has a thickness L2 of about 200–400 µm.

Figure 3A:
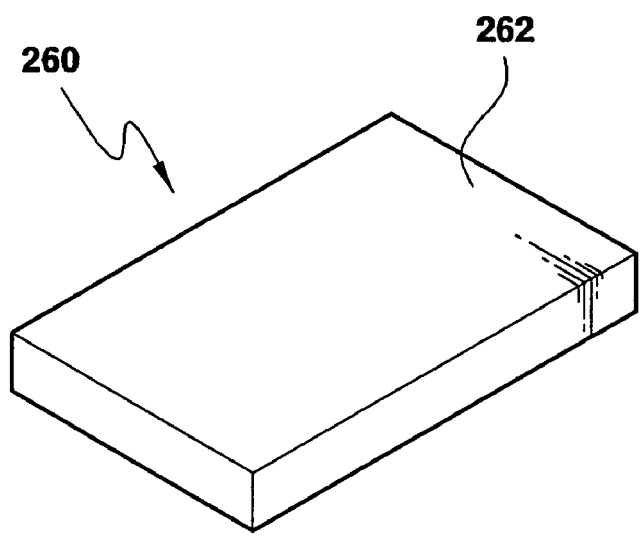
FIGS. 3A through 3C are perspective views showing a heat slug applied in the semiconductor package according to the present invention.
Figure 3B:
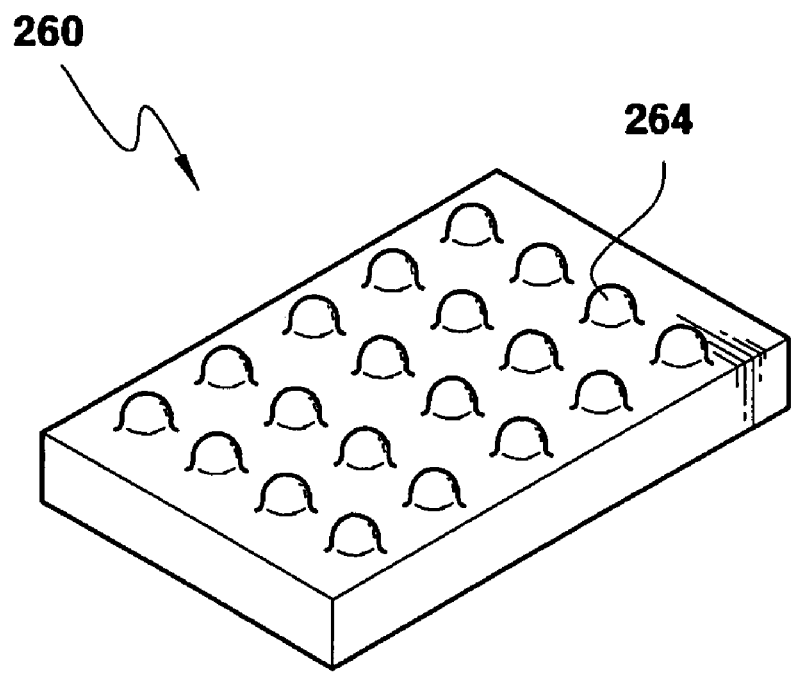
Figure 3C:
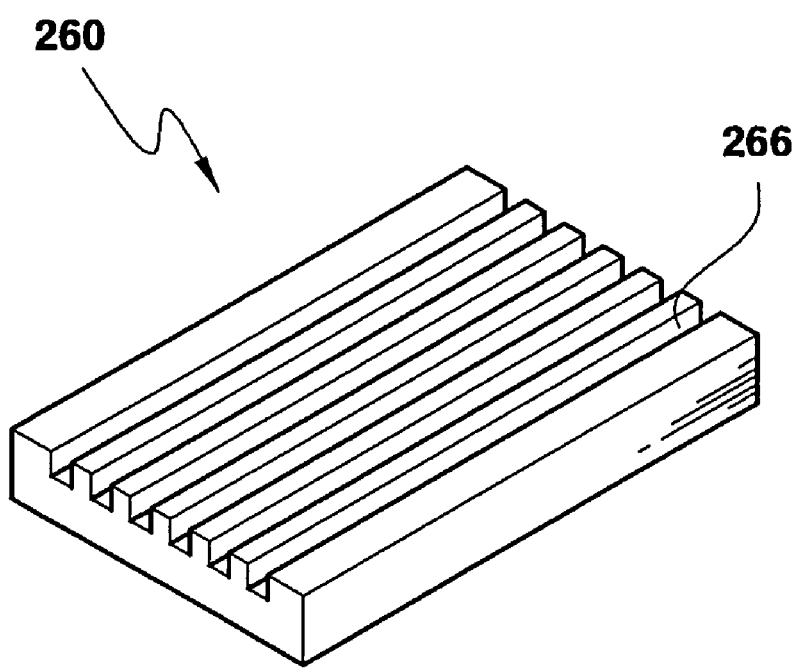

FIGS. 3A through 3C are perspective views showing the heat slug 260 according to the illustrative embodiment of the present invention. As shown in FIGS. 3A through 3C, the heat slug 260 may have a planar surface 262. Further, one surface of the heat slug 260 has protrusions 264 or grooves 266 so that the effect of dissipating heat generated by the semiconductor chip 230 can be maximized.

As shown in FIG. 2E, the heat spreader 270 is formed on the heat slug 260 to be spaced a buffer gap L3 apart from the heat slug 260. Preferably, the buffer gap L3 is wide enough to serve as a buffer between the heat spreader 270 and the heat slug 260, for example, about 100 µm or less. Here, the buffer gap L3 plays a role as a buffer to absorb a pressure applied during encapsulation of the semiconductor chip 230, and transfers the heat of the heat slug 260 to the heat spreader 270. Damage which may be applied to the semiconductor chip 230 due to a mold pressure applied during encapsulation of elements formed on the substrate 210 using insulating encapsulant resins 280 can be prevented by providing a thin buffer gap L3 between the heat slug 260 and the heat spreader 270. In order for the buffer gap L3 to perform such functions, the buffer gap L3 is more preferably in a range of about 20–30 μm.

The heat spreader 270 includes an upper plate portion 272 and a support 274. The upper plate portion 272 is formed on the heat slug 260 and spaced the predetermined buffer gap L3 apart from the heat slug 260. The support 274 is formed on a lower surface of and at an edge of the upper plate portion 272, is adhered to the substrate 210, and supports the upper plate portion 272. Here, the upper plate portion 272 of the heat spreader 270 has a thickness of about 100–200 μm and a flat shape. It is preferable that the heat spreader 270 is made of a highly thermally conductive material selected from the group consisting of copper, a copper alloy, aluminum, an aluminum alloy, steel, stainless steel, and a combination thereof. The heat spreader 270 can be manufactured by casting, forging, press-molding, and the like.

The insulating encapsulant resin 280 encapsulates the semiconductor chip 230, the heat slug 260 and the heat spreader 270 mounted on the substrate 210 to protect them from external impact. As shown in FIG. 2E, one surface of the upper plate portion 272 of the heat spreader 270 is exposed to effectively dissipate the heat from the heat spreader 270 to the outside of the package 200. Thus, the substrate 210, the semiconductor chip 230, the heat slug 260 and the support 274 of the heat spreader 270 are encapsulated by the insulating encapsulant resin 280. For example, epoxy molding compound (EMC) can be used as the insulating encapsulant resin 280.

In the above-described embodiment of the present invention, an electric signal output from an external system board (not shown) is input to the semiconductor chip 230 via the solder balls 290, the substrate 210 and the bonding means 240. Conversely, an electric signal output from the semiconductor chip 230 is input to the external system board via the bonding means 240, the substrate 210 and the solder balls 290. The semiconductor chip 230 may be driven at a high speed through the above-described input and output processes. The amount of heat generated from the semiconductor chip 230 may be proportional to the speed at which the semiconductor chip 230 is driven.

In the present invention, as described above, the heat slug 260 and the heat spreader 270 having a high thermal conductivity are disposed on the upper part of the semiconductor chip 230. Thus, although a large amount of heat is generated from the semiconductor chip 230 that may operate at a high speed, the heat can be more easily dissipated using the heat slug 260 and the heat spreader 270. As a result, malfunction of the semiconductor chip 230 due to a hindrance in thermal dissipation can be prevented.

Hereinafter, a method of manufacturing the semiconductor package according to the illustrative embodiment of the present invention is explained in reference to FIGS. 2A through 2E.

As shown in FIG. 2A, the semiconductor chip 230 is adhered to the substrate 210 using an adhesive 220, e.g., silver paste. Electrode pads (not shown) of the substrate 210 are electrically connected with bonding pads (not shown) of the semiconductor chip 230 by the bonding means 240.

As shown in FIG. 2B, the adhesive 250 is applied to the upper surface of the semiconductor chip 230, followed by adhering the heat slug 260 to the semiconductor chip 230, thereby preventing I/O bonding pads (not shown) formed on the upper surface of the semiconductor chip 230 from being damaged.

As shown in FIG. 2C, the heat spreader 270 is formed on the heat slug 260 to be spaced the predetermined buffer gap L3 apart from the heat slug 260.

As shown in FIG. 2D, the semiconductor chip 230, the bonding means 240, the heat slug 260, and the heat spreader 270 are protected by molding using the insulating encapsulant resin 280, for example, EMC. Here, in order to ensure thermal dissipation efficiency, the upper surface of the heat spreader 270 is not covered by the insulating encapsulant resin 280.

As shown in FIG. 2E showing a step of forming external I/O terminals, after completing the encapsulating, the external I/O terminals of the semiconductor package 200, that is, the solder balls 290 shown in FIG. 2E, are formed. It is preferable, but not mandatory, that the forming of the external I/O terminals is performed after the encapsulating. The external I/O terminals can be optionally formed regardless of the order of formation of the semiconductor package 200.

While certain exemplary embodiments have been described and shown in the accompanying drawings, it will be appreciated that various changes in form and details may be made therein without departing from the spirit and scope of the present invention as defined by the following claims. Therefore, it is to be understood that the above described embodiment is for purposes of illustration only and not to be construed as a limitation of the invention.

As described above, in accordance with a semiconductor package with a heat dissipating structure and a method of manufacturing the same according to the present invention, heat generated from a semiconductor chip can be quickly dissipated by a heat slug and a heat spreader made of a highly thermally conductive material.

Further, the semiconductor chip can be stably protected in an encapsulating process using insulating encapsulant resin by an adhesive between the heat slug and the semiconductor chip and a gap between the heat slug and the heat spreader. That is, since thermal dissipation function and a protective function of the semiconductor chip can be simultaneously carried out in the semiconductor package, according to the present invention, excellent performance of the semiconductor chip can be maintained for a long time.

What is claimed is:

1. A semiconductor package with a heat dissipating structure comprising:
   a substrate;
   a semiconductor chip mounted on the substrate and electrically connected thereto;
   a heat slug coupled to the semiconductor chip, the heat slug being formed of a thermally conductive material selected from the group consisting of copper, a copper alloy, aluminum, an aluminum alloy, steel, stainless steel, and a combination thereof; and
   a heat spreader partially exposed to the outside of the semiconductor package, the heat spreader formed over the heat slug to be spaced apart from the heat slug, wherein the heat spreader is spaced apart from the heat slug by a gap of about 20–30 μm, and the heat slug has a thickness of about 200–400 μm.

2. The semiconductor package of claim 1, wherein one surface of the heat slug is shaped of a planar surface, protrusions, grooves or a combination thereof.

3. The semiconductor package of claim 1, wherein the heat spreader comprises:
   an upper plate portion having one surface exposed to the outside of the semiconductor package and another surface formed over the heat slug to be spaced apart from the heat slug; and
   a support formed on a lower surface of an edge of the upper plate portion, the support being adapted to support the upper plate portion on the substrate.

4. The semiconductor package of claim 3, wherein the upper plate portion of the heat spreader has a thickness of about 100–200 µm.

5. The semiconductor package of claim 3, wherein the upper plate portion of the heat spreader has a substantially flat surface.

6. The semiconductor package of claim 3, wherein the substrate, the semiconductor chip, the heat slug and the support of the heat spreader are encapsulated by an insulating encapsulant resin, the resin exposing a surface of the upper plate portion of the heat spreader.

7. The semiconductor package of claim 6, wherein the insulating encapsulant resin is epoxy molding compound (EMC).

8. The semiconductor package of claim 1, wherein the heat spreader is made of a highly thermally conductive material selected from the group consisting of copper, a copper alloy, aluminum, an aluminum alloy, steel, stainless steel, and a combination thereof.

9. The semiconductor package of claim 1, wherein the semiconductor chip and the heat slug are coupled by an adhesive, and wherein the adhesive is an electric insulator and a thermal conductor.

10. The semiconductor package of claim 9, wherein the adhesive is thermally conductive resin.

11. The semiconductor package of claim 9, wherein the adhesive is a buffer adhesive made of silicon rubber or an elastomer material.

12. The semiconductor package of claim 1, wherein the semiconductor chip is electrically connected to the substrate through a bonding wire.

13. A method of manufacturing a semiconductor package with a heat dissipating structure, the method comprising:
   electrically coupling a semiconductor chip to a substrate;
   coupling a heat slug to an upper surface of the semiconductor chip, the heat slug being made of a thermally conductive material selected from the group consisting of copper, a copper alloy, aluminum, an aluminum alloy, steel, stainless steel, and a combination thereof; and
   forming a heat spreader over an upper part of the heat slug to be spaced apart from the heat slug, wherein the heat spreader is formed over the heat slug to be spaced apart by a gap of about 20–30 µm from the heat slug, and the heat slug has a thickness of about 200–400 µm.

14. The method of claim 13, further comprising encapsulating the substrate, the semiconductor chip, the heat slug and a support of the heat spreader by an insulating encapsulant resin to expose one surface of an upper plate portion of the heat spreader, after forming the heat spreader.

15. The method of claim 13, wherein the heat slug has one surface shaped of a planar surface, protrusions, grooves or a combination thereof.

16. The method of claim 13, wherein the heat spreader includes an upper plate portion having one surface exposed to the outside of the semiconductor package and another surface formed on the heat slug to be spaced apart from the heat slug, and wherein a support which is formed on a lower surface of an edge of the upper plate portion, the support being adapted to support the upper plate portion on the substrate.

17. The method of claim 13, wherein the heat spreader is made of a highly thermally conductive material selected from the group consisting of copper, a copper alloy, aluminum, an aluminum alloy, steel, stainless steel, and a combination thereof.

18. The method of claim 13, wherein the semiconductor chip and the heat slug are adhered by an adhesive and the adhesive is an electric insulator and a thermal conductor.

* * * * *